(12) United States Patent
Chang et al.

(10) Patent No.: US 12,041,746 B2
(45) Date of Patent: Jul. 16, 2024

(54) FIXING DEVICE AND ACCOMMODATION DEVICE USING THE SAME

(71) Applicant: DELTA ELECTRONICS, INC., Taoyuan (TW)

(72) Inventors: Chiu-Chin Chang, Taoyuan (TW);
Kuan-Lung Wu, Taoyuan (TW);
Li-Hsiu Chen, Taoyuan (TW);
Wen-Yin Tsai, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 46 days.

(21) Appl. No.: 17/657,635

(22) Filed: Apr. 1, 2022

(65) Prior Publication Data

US 2023/0042043 A1 Feb. 9, 2023

Related U.S. Application Data

(60) Provisional application No. 63/203,870, filed on Aug. 3, 2021.

(30) Foreign Application Priority Data

Jan. 5, 2022 (CN) .......................... 202210003668.6

(51) Int. Cl.
*G06F 1/18* (2006.01)
*G11B 33/12* (2006.01)
(Continued)

(52) U.S. Cl.
CPC ........... *H05K 7/1489* (2013.01); *G06F 1/187* (2013.01); *G11B 33/128* (2013.01); *H05K 7/1415* (2013.01); *H05K 7/20236* (2013.01)

(58) Field of Classification Search
CPC .... H05K 5/0221; H05K 5/023; H05K 7/1411; H05K 7/1415; H05K 7/1488;
(Continued)

(56) References Cited

U.S. PATENT DOCUMENTS 3,193,316 A * 7/1965 James .................. H05K 7/1415
294/99.1
3,617,083 A * 11/1971 Koppensteiner ..... H05K 7/1415
254/28
(Continued)

FOREIGN PATENT DOCUMENTS

| JP | 6515233 B1 | 5/2019 |
| JP | 3229039 U | 11/2020 |

(Continued)

OTHER PUBLICATIONS

The pertinent parts of TWM601953U.

*Primary Examiner* — Adrian S Wilson
*Assistant Examiner* — Gage Crum
(74) *Attorney, Agent, or Firm* — CKC & Partners Co., LLC

(57) ABSTRACT

A fixing device includes a main body, a sliding block, and a fixing rod. The main body has a sliding rail and a guiding hole, and the sliding rail which is disposed at a front side of the main body vertically extends. The guiding hole adjoins the sliding rail and horizontally extends through the main body. The sliding block is slidably connected to the sliding rail. The fixing rod is movably connected to the sliding block extending through the guiding hole, and the sliding block is configured to move along the sliding rail and enable the guiding hole to drive the fixing rod to horizontally move.

12 Claims, 16 Drawing Sheets

(51) Int. Cl.
*H05K 7/14* (2006.01)
*H05K 7/20* (2006.01)

(58) Field of Classification Search
CPC ....... H05K 7/1489; G06F 1/183; G06F 1/184; G06F 1/187; A47B 88/43; G11B 33/128; F16B 21/09
See application file for complete search history.

(56) References Cited

U.S. PATENT DOCUMENTS

| | | | | |
|---|---|---|---|---|
| 3,626,575 | A * | 12/1971 | Greenspan | H05K 7/1415 29/764 |
| 3,696,492 | A * | 10/1972 | Baillard | H05K 7/1415 29/758 |
| 3,867,753 | A * | 2/1975 | Urban, II | B25B 27/02 29/278 |
| 6,178,611 | B1 * | 1/2001 | Boe | H05K 7/1415 29/270 |
| 8,089,752 | B2 * | 1/2012 | Xu | G06F 1/187 361/679.33 |
| 8,310,827 | B2 * | 11/2012 | Huang | G06F 1/187 361/679.33 |
| 8,614,894 | B2 | 12/2013 | Zhang et al. | |
| 9,253,915 | B2 | 2/2016 | Mao | |
| 10,185,373 | B1 | 1/2019 | Chen et al. | |
| 10,368,460 | B1 * | 7/2019 | Yang | H05K 7/1411 |
| 11,603,871 | B2 * | 3/2023 | Wang | F16B 1/04 |
| 2003/0200630 | A1 * | 10/2003 | Feldmeyer | A45F 5/10 16/422 |
| 2005/0121581 | A1 * | 6/2005 | Chen | G06F 1/187 |
| 2006/0133030 | A1 * | 6/2006 | Takahashi | G06F 1/184 |
| 2007/0230105 | A1 * | 10/2007 | Su | G06F 1/187 361/679.33 |
| 2007/0274034 | A1 * | 11/2007 | Yang | G06F 1/187 720/601 |
| 2008/0157638 | A1 * | 7/2008 | Liu | G11B 33/124 312/223.2 |
| 2011/0032665 | A1 * | 2/2011 | Huang | G06F 1/187 361/679.01 |
| 2015/0063905 | A1 * | 3/2015 | Wang | F16B 21/09 403/327 |
| 2015/0156912 | A1 * | 6/2015 | Liang | H05K 7/1489 292/164 |
| 2015/0173217 | A1 * | 6/2015 | Mao | H05K 7/1411 312/332.1 |
| 2019/0138066 | A1 | 5/2019 | Chen et al. | |
| 2019/0147915 | A1 * | 5/2019 | Wang | F16B 13/124 361/679.34 |
| 2020/0340514 | A1 * | 10/2020 | Wang | F16B 19/1027 |
| 2021/0324911 | A1 | 10/2021 | Hsieh | |

FOREIGN PATENT DOCUMENTS

| | | |
|---|---|---|
| TW | I554184 B | 10/2016 |
| TW | 201638938 A | 11/2016 |
| TW | M601953 U | 9/2020 |

* cited by examiner

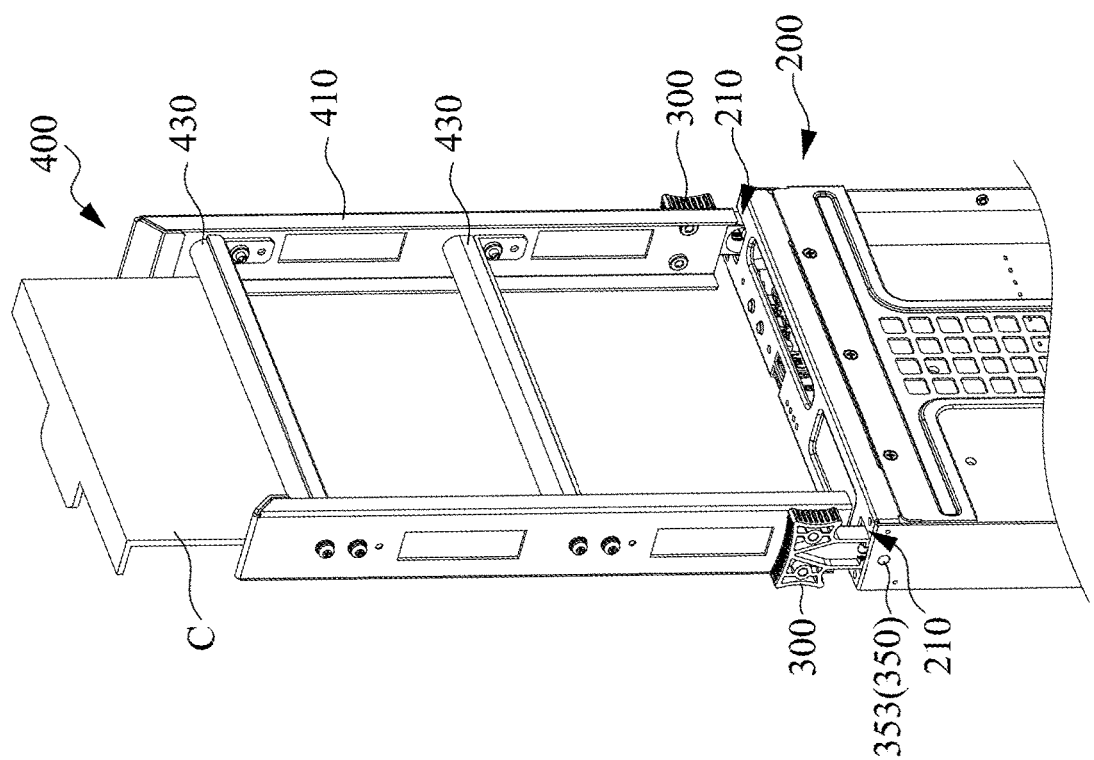

FIXING DEVICE AND ACCOMMODATION DEVICE USING THE SAME

CROSS-REFERENCE TO RELATED APPLICATION

This application claims priority to U.S. Provisional Application Ser. No. 63/203,870, filed Aug. 3, 2021, and China Application Serial Number 202210003668.6, filed Jan. 5, 2022, which are herein incorporated by reference in their entireties.

BACKGROUND

Field of Invention

The present invention relates to a fixing device and an accommodation device using the same.

Description of Related Art

As the digital living space getting popular and the requirement of internet service growing, the host server equips with more hardware structures to obtain more storage resource.

It is critical for designers to consider not only the hard drive storage capacity but also depths of the server accommodation cabinet, the opening directions, the power supply, and the heat dissipation thereof. The server accommodation cabinet might be at an environment with liquid, and some server accommodation cabinets are cooled down by liquid. Nevertheless, the liquid might generate upward buoyancy to the server which dislocates the server away from its storage position.

As known from the above description, there is a need to develop a server accommodation device which can stably fix servers, so as to prevent the server from dislocating away from the storage position due to the buoyancy.

SUMMARY

The invention provides a fixing device including a main body, a sliding block, and a fixing rod. The main body has a sliding rail and a guiding hole, and the sliding rail which is disposed at and vertically extends along a front side of the main body. The guiding hole adjoins the sliding rail and horizontally extends through the main body. The sliding block is slidably connected to the sliding rail. The fixing rod is movably connected to the sliding block and extends through the guiding hole, and the sliding block is configured to move along the sliding rail and enable the guiding hole to drive the fixing rod to horizontally move.

In some embodiments of the present invention, the fixing device fixes an electrical device to an accommodation structure, and the fixing device is configured to move along an operation direction to enable the electrical device to be detachable from the accommodation structure and to drive the electrical device to move outside of the accommodation structure along a detaching direction, and the operation direction is the same as the detaching direction.

In some embodiments of the present invention, the fixing device includes an elastic component, and the fixing rod has a head portion and a neck portion. The sliding block has a blocking portion, and the elastic component is disposed at the neck portion and between the head portion and the blocking portion.

In some embodiments of the present invention, the fixing rod further includes a cone portion which is in contact with an inner surface of the guiding hole, and the cone portion has a vertical length extending toward a back side of the main body.

In some embodiments of the present invention, the guiding hole has an internal diameter increasing toward a back side of the main body.

In some embodiments of the present invention, the fixing rod horizontally extends through the sliding block such that the sliding block limits the fixing rod in a vertical axis. The fixing rod is configured to move relative to the sliding block in a horizontal axis.

In some embodiments of the present invention, the guiding hole includes a sloped bottom surface which is higher at a front side of the main body and lower at a back side of the main body.

An aspect of the present invention is related to an accommodation device including an accommodation cabinet, a shell, and at least one fixing device. The accommodation cabinet has a top opening, two walls, and a positioning hole, and the two walls are parallel and disposed at an interior surface of the accommodation cabinet. A path is defined between the two walls, and the positioning hole is disposed at the interior surface and between the two walls. The shell has an upper hole and at least one fixing hole, and the shell is configured to move between the two walls along a vertical axis. The at least one fixing device extends through the upper hole, and the at least one fixing device includes a main body, a sliding block, and a fixing rod. The main body has a sliding rail and a guiding hole, and the sliding rail is disposed at and vertically extends along a front side of the main body, the guiding hole adjoins the sliding rail and horizontally extends through the main body. The sliding block is slidably connected to the sliding rail. The fixing rod is configured to fix the shell to the main body, and the fixing rod is movably connected to the sliding block and in contact with the main body. The fixing rod extends through the fixing hole and the positioning hole, and the main body is configured to receive a force to vertically move relative to the sliding block such that the guiding hole guides the fixing rod to move into the positioning hole or move outside of the positioning hole in a horizontal axis.

In some embodiments of the present invention, a distance between top portions of the two walls gradually increases upward along vertical axis.

In some embodiments of the present invention, the accommodation cabinet includes a guiding structure which is disposed between the two sidewalls and is above the positioning hole, and the guiding structure extends upward and gradually extends away from the path.

In some embodiments of the present invention, the accommodation device further includes a hanging bracket, and the at least one fixing device includes two fixing devices. The hanging bracket includes two lateral arms and a supporting rod which is connected between the two lateral arms, and the two lateral arms respectively join the two fixing devices.

An aspect of the present invention relates to an accommodation device including an accommodation cabinet, a shell, and at least one fixing device. The accommodation cabinet has a top opening, two walls, and a positioning hole, and the two walls are parallel and disposed at an interior surface of the accommodation cabinet. A path is defined between the two walls, and the positioning hole is disposed at the interior surface and between the two walls. The shell has an upper hole and at least one fixing hole, and the shell is configured to move between the two walls along a vertical axis. The at least one fixing device extends through the upper hole, and the at least one fixing device includes a main body, a sliding block, and a fixing rod. The main body has a sliding rail and a guiding hole, and the sliding rail is disposed at and vertically extends along a front side of the main body, the guiding hole adjoins sliding rail and horizontally extends through the main body. The sliding block is slidably connected to the sliding rail. The fixing rod is configured to fix the shell to the main body, and the fixing rod is movably connected to the sliding block and in contact with the main body, the fixing rod extends through the fixing hole and the positioning hole. The main body is configured to move downward relative to the sliding block such that the guiding hole guides the fixing rod to move into the positioning hole. The main body is configured to move upward relative to the sliding block such that the guiding hole guides the fixing rod to move outside of the positioning hole.

In embodiments of the present invention, a purpose is to improve traditional and manufacturing processes for detaching and assembling an electronic assembly. With the accommodation device and the fixing device in the present invention, the electronic assembly has a detaching direction and an unlocking operation direction the same as the detaching direction. As such, a user or an automatic arm can efficiently and easily apply a force in one single direction for inserting and locking the electronic assembly to the accommodation structure. The user or the automatic arm can also apply a force in one single direction for detaching and unlocking the electronic assembly from the accommodation structure. Therefore, the present invention can not only improve the traditional manufacturing process but also make the efficiency about automatic production and the efficiency to assemble electrical components better. In addition, the fixing device can stably fix a server to the accommodation structure in a locking state, so as to prevent the buoyancy generated by the liquid in the accommodation structure from affecting the server. The user can easily pull the fixing device to release the server from the locking state, and the user can move the server out of the accommodation structure without touching the liquid.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIGS. 15 and 16 illustrate schematic views of the fixing device and a hanging bracket in accordance with some embodiments of the present invention.

DETAILED DESCRIPTION

Figure 1:
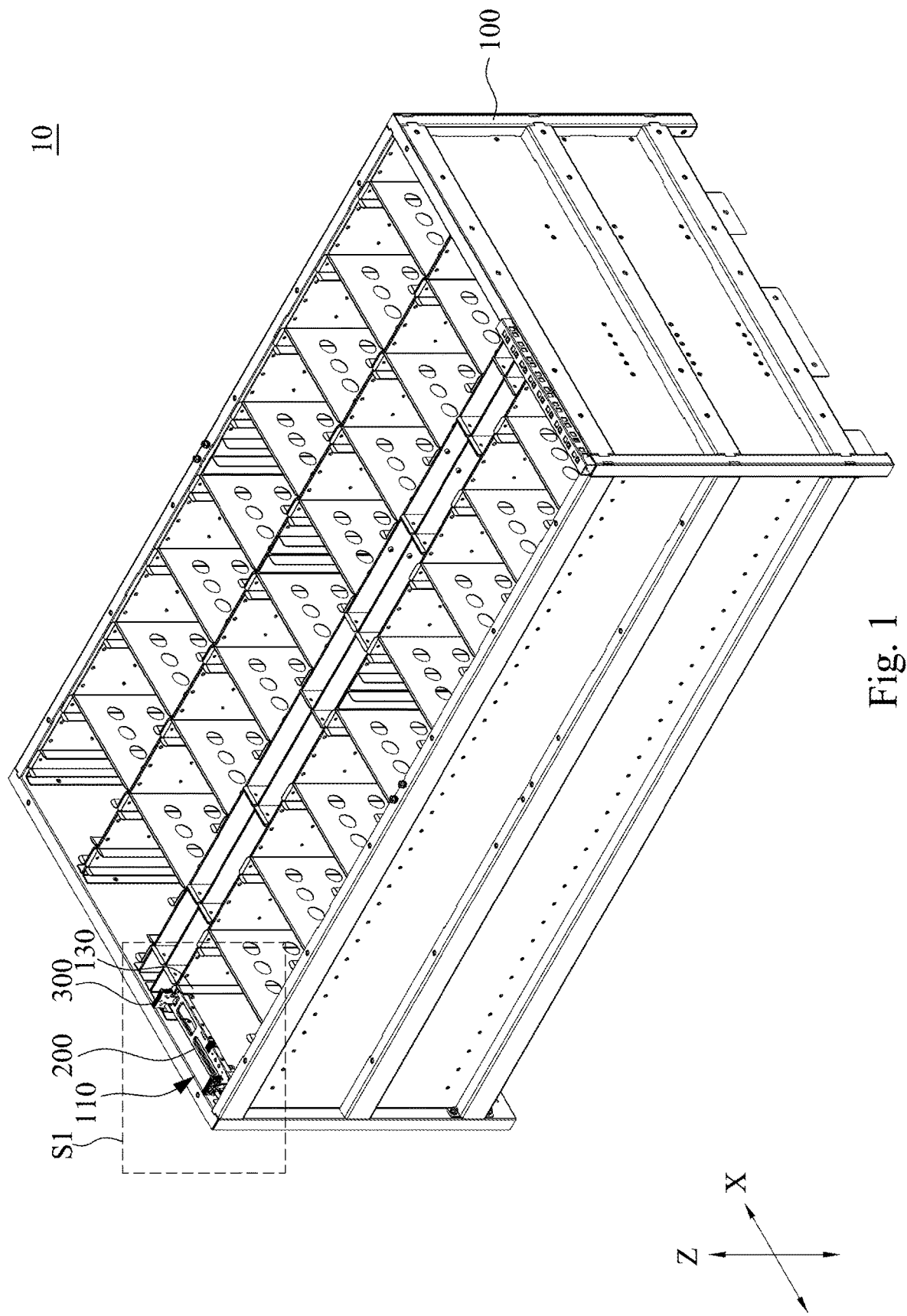
FIG. 1 illustrates a schematic view of an accommodation device in accordance with some embodiments of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
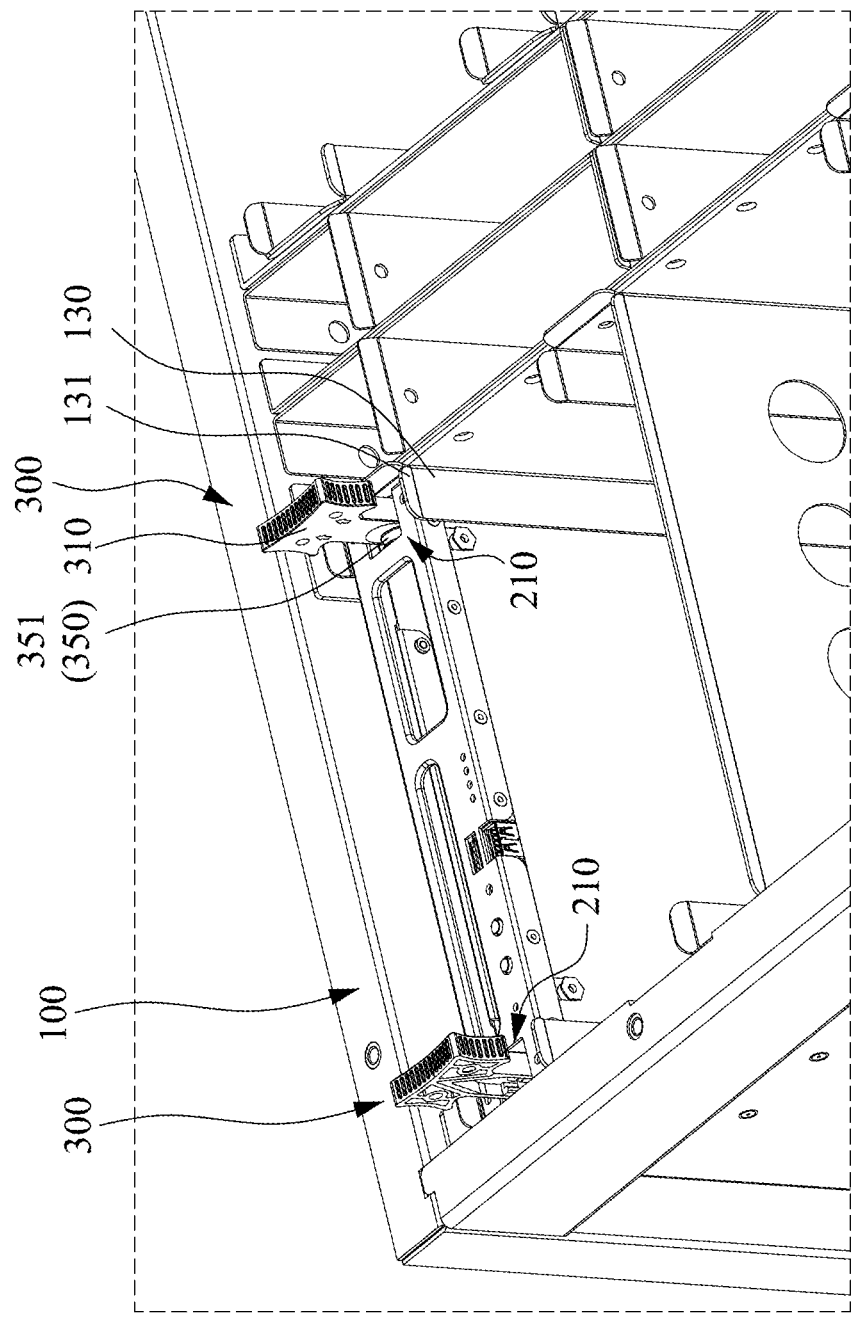
FIG. 2 illustrates an enlarged view according to the dotted square S1 in FIG. 1.
Figure 3:
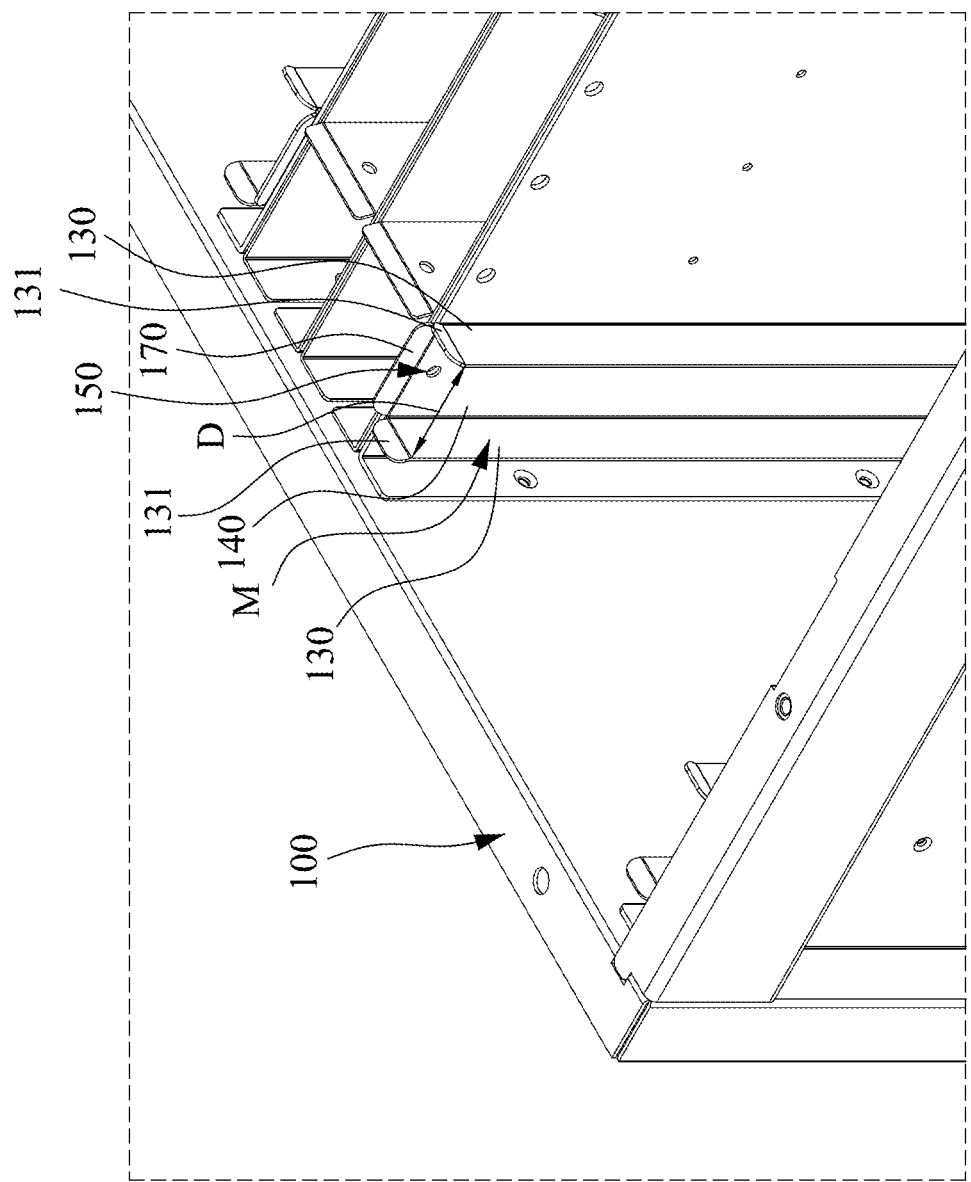
FIG. 3 illustrates an enlarged view according to the dotted square S1 in FIG. 1, and a fixing device and an electronic assembly are neglected.

Please refer to FIGS. 1-3. FIG. 1 illustrates a schematic view of an accommodation device 10 which includes an accommodation structure 100, an electronic assembly 200, and a fixing device 300. FIGS. 2-3 illustrate enlarged views of dotted square S1 in the FIG. 1, and the electronic assembly 200 and the fixing device 300 are neglected in FIG. 3. In some embodiments of the present invention, the accommodation structure 100 includes a top opening 110, two walls 130, and a positioning hole 150, and the two walls 130 vertically extend on an interior surface 140 of the accommodation structure 100. The two walls 130 which are parallel to each other define a path M (referring to FIG. 3) extending along a vertical axis Z, and the positioning hole 150 is disposed on the interior surface 140 and disposed between the two walls 130. Therefore, users can move the electronic assembly 200 into the accommodation structure 100 along the path M or move the electronic assembly 200 out of the accommodation structure 100 along the path M.

Specifically, the accommodation structure 100 can be a structure which can accommodate the electronic assembly 200, and the accommodation structure 100 can be an accommodation cabinet, a chassis, electrical equipment with an accommodating function, or mechanical equipment with an accommodation function. The electronic assembly 200 can be a server, a hard drive such as mechanical hard drive and solid-state drive, or a printed circuit board. The present invention is not limited in this respect. In addition, the electronic assembly 200 has an outer shell, and the accommodation structure 100 and the outer shell of the electronic assembly 200 can be made of alloy or polymer, the outer shell of the electronic assembly 200 can protect components therein. The interior surface 140 can include an inner surface of the accommodation structure 100 or a surface of a board which is inserted into the accommodation structure 100, and the board is an alloy board or a polymer board. The present invention is not limited in this respect. Moreover, the walls 130 can also be made of alloy, and the walls 130 are manufactured by a machining process or a bending process, and the walls 130 are fixed to the accommodation structure 100 by soldering or locking. The present invention is not limited in this respect.

Figure 4:
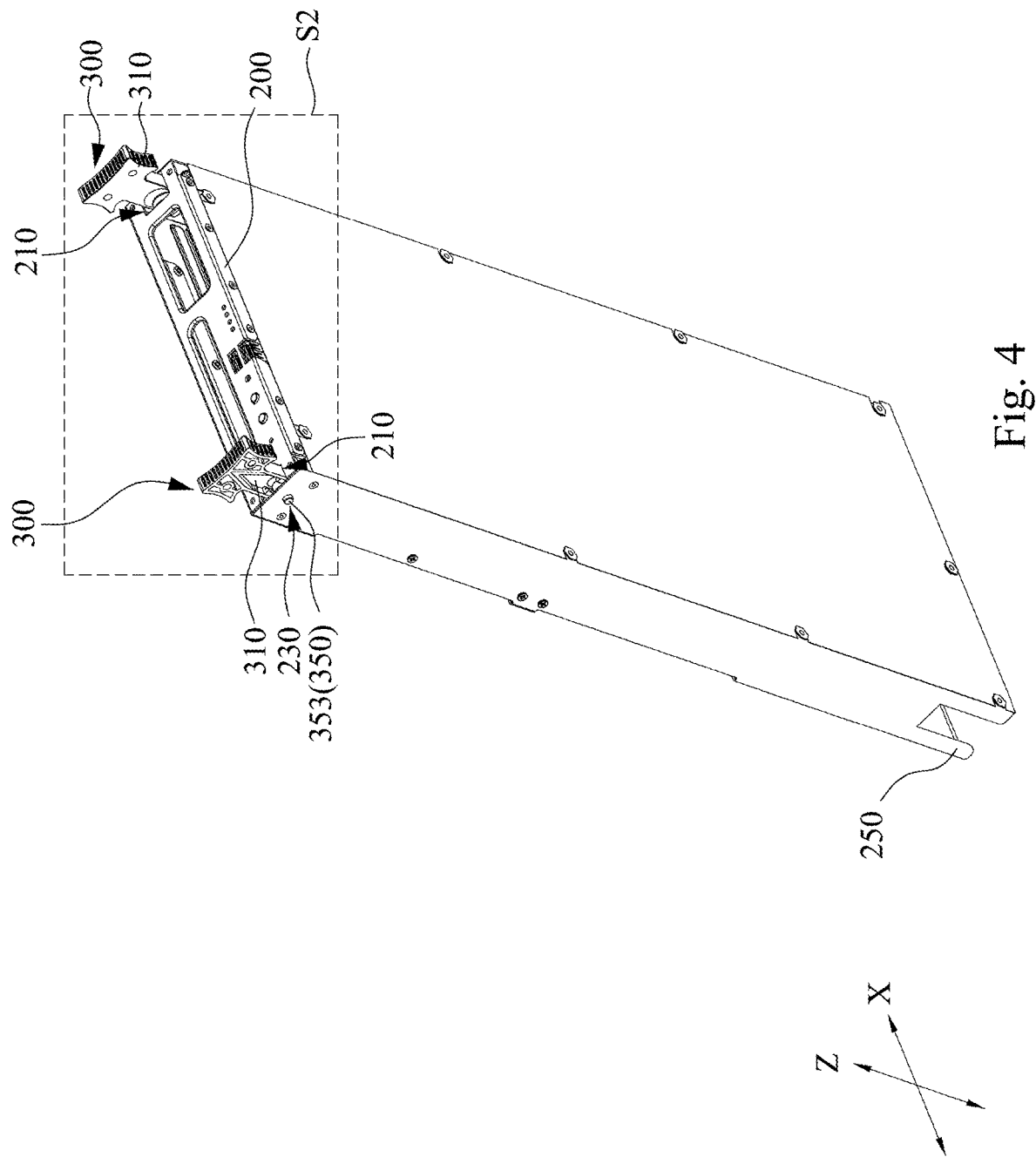
FIG. 4 illustrates a schematic view about a fixing device and an electronic assembly in accordance with some embodiments of the present invention.
Figure 5:
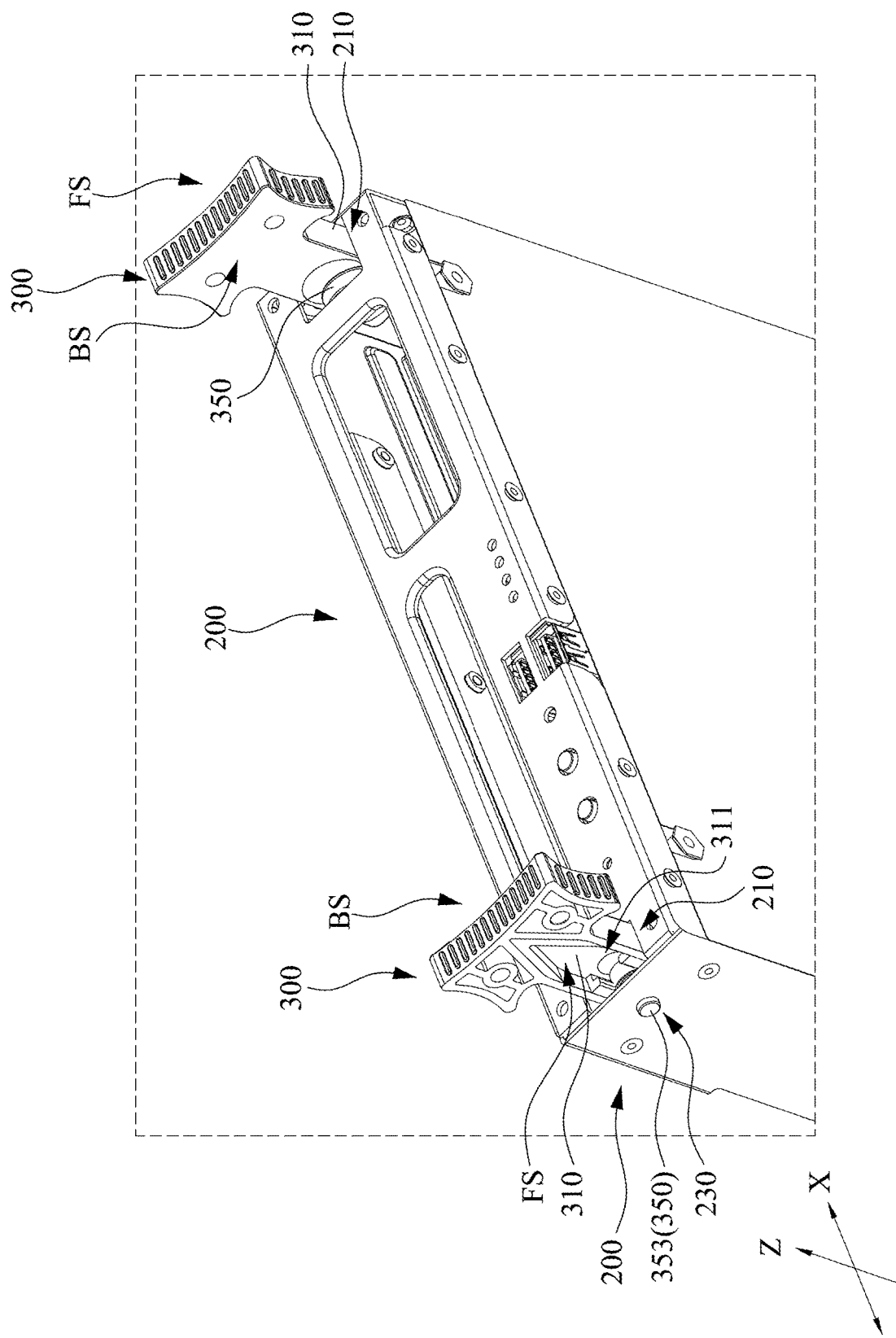
FIG. 5 illustrates an enlarged view according to the dotted square S2 in FIG. 4.
Figure 6:
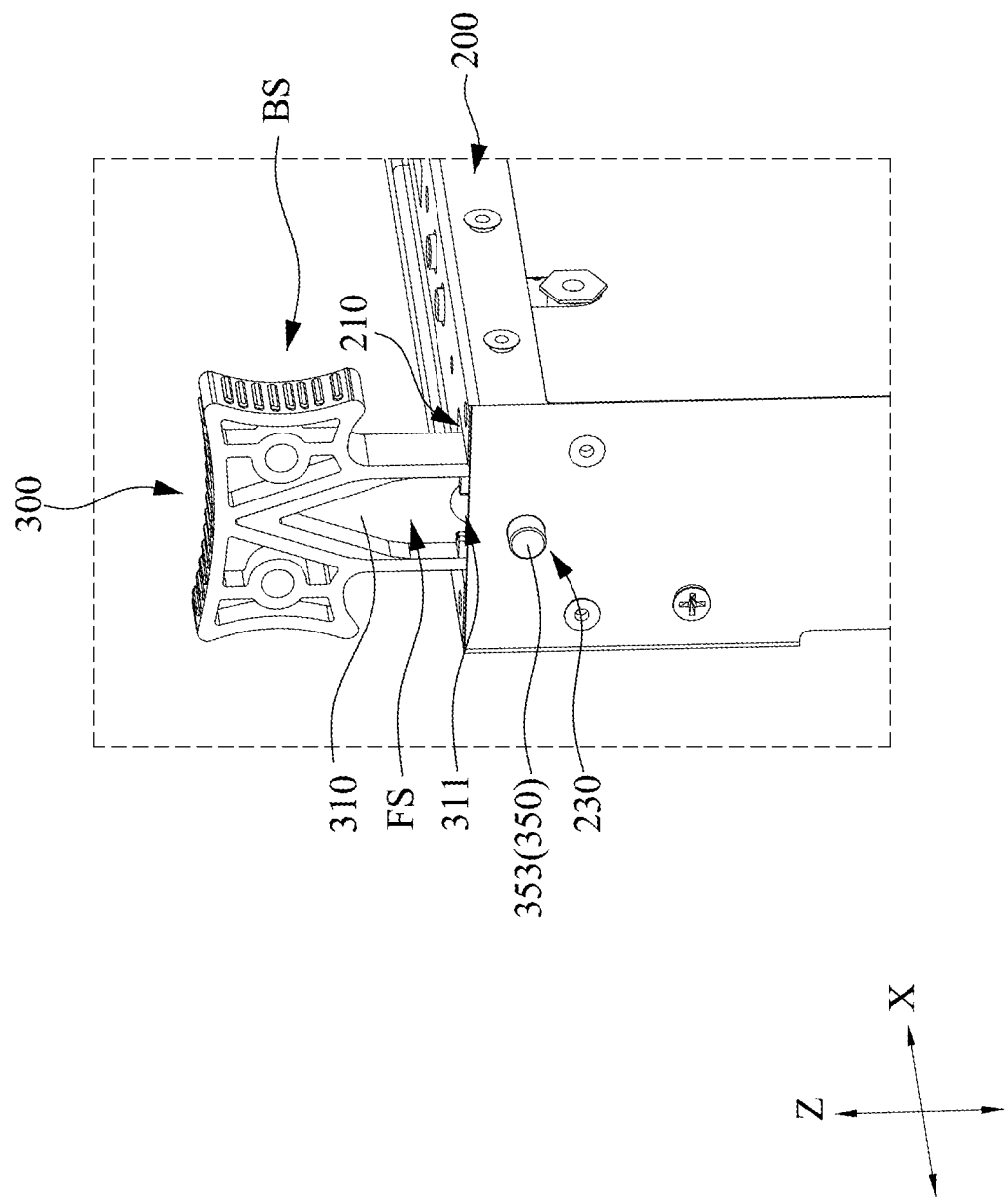
FIG. 6 illustrates an enlarged view of the fixing device and the electronic assembly in a view point different from FIG. 4.
Figure 10:
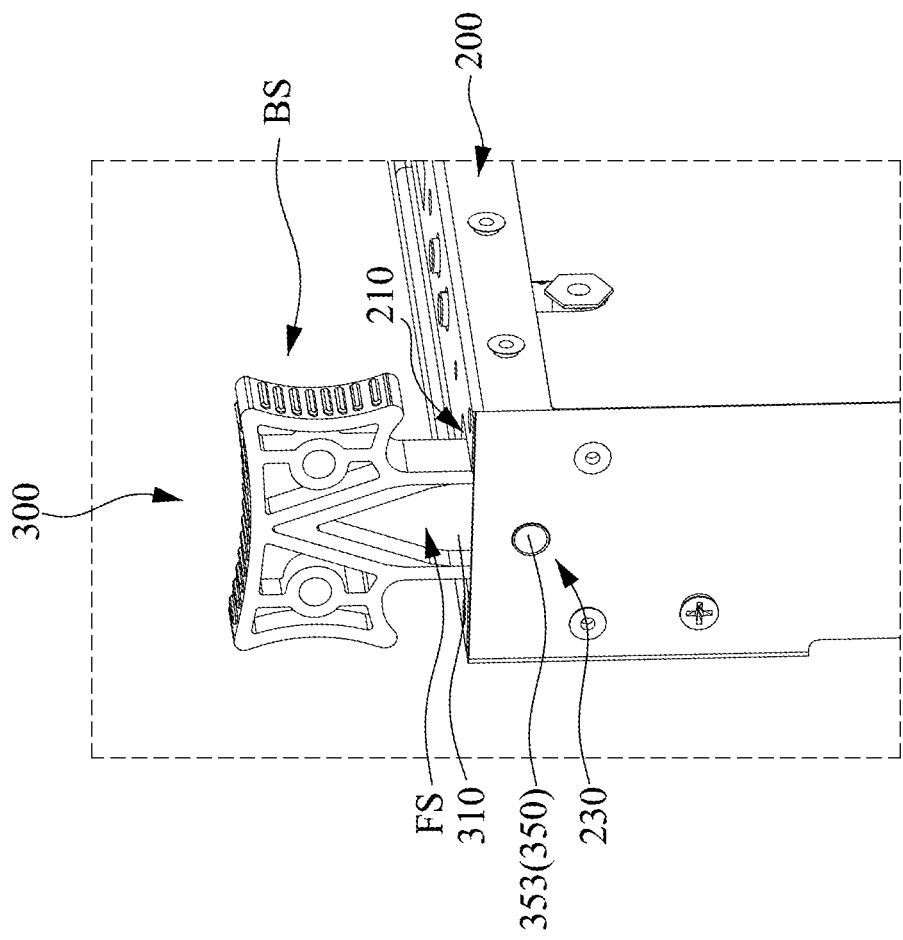
FIG. 10 illustrates an enlarged view of the fixing device and the electronic assembly in a view point different from FIG. 4.

Reference is made to FIGS. 2, 5, 6, and 10. FIG. 5 illustrates an enlarged view of a dotted square S2 in the FIG. 4, and FIGS. 6 and 10 illustrate different enlarged views of the electronic assembly 200 and the fixing device 300 in FIG. 4 in different viewpoints. In FIG. 6, the fixing device 300 is in a locking state. In FIG. 10, the fixing device 300 releases the locking state. In some embodiments of the present invention, the electronic assembly 200 includes an upper hole 210 and a fixing hole 230 which is located at a lateral side of the electronic assembly 200, and the electronic assembly 200 is configured to move between the two walls 130 along the vertical axis Z. In practical application, the electronic assembly 200 can be moved along the path M (referring to FIG. 3) between the two walls 130 to be disposed in the accommodation structure 100, and then the fixing device 300 fixes the electronic assembly 200 to the accommodation structure 100 such that the electronic assembly 200 is in a fixing state (referring to FIG. 6). For instance, the fixing device 300 fixes the shell of the electronic assembly 200 to the accommodation structure 100. In addition, the fixing device 300 can be pulled for releasing the fixing state of the electronic assembly 200 and be detachable from the accommodation structure 100 (referring to FIG. 10). Detail structures and information about the electronic assembly 200 which is in the locking state or is released from the locking state are introduced in the following paragraphs below.

Figure 7:
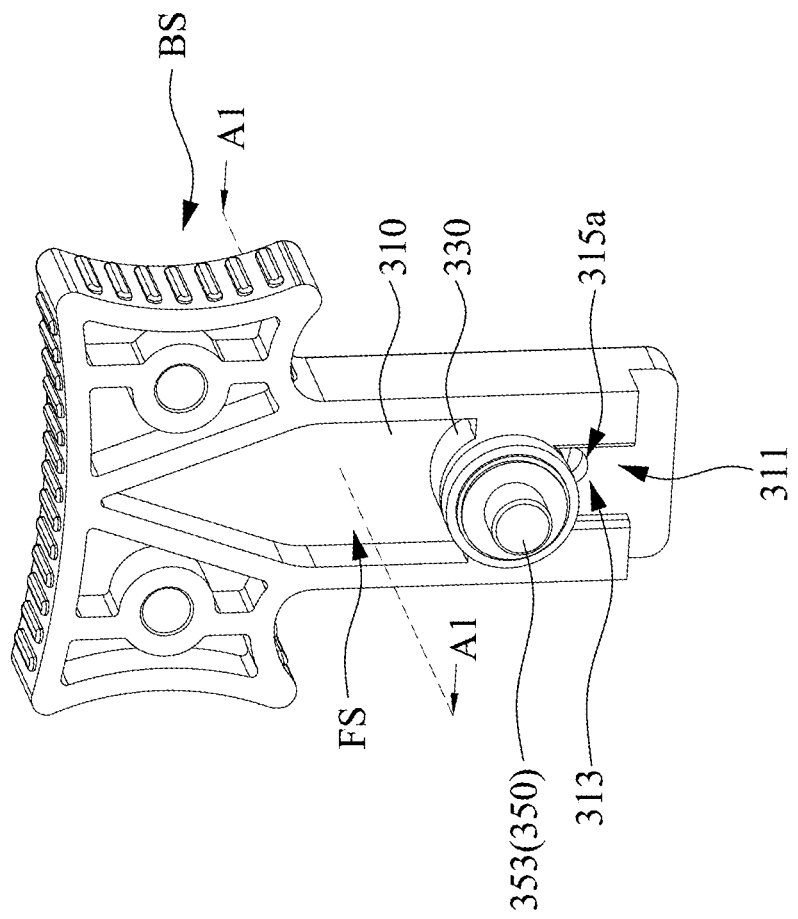
FIG. 7 illustrates a front view of the fixing device in accordance with some embodiments of the present invention.
Figure 8:
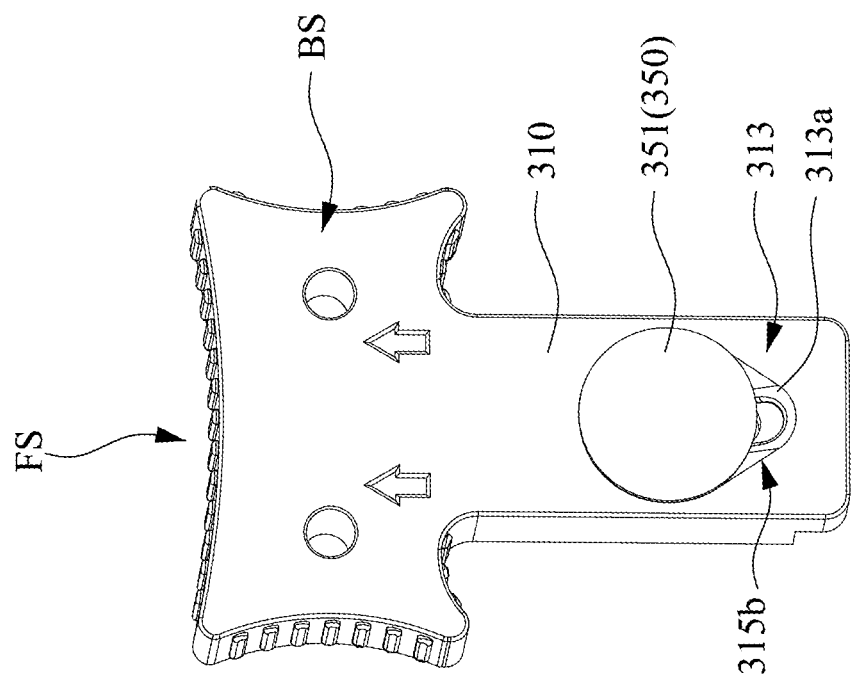
FIG. 8 illustrates a back side of the fixing device in accordance some embodiments of the present invention.
Figure 9:
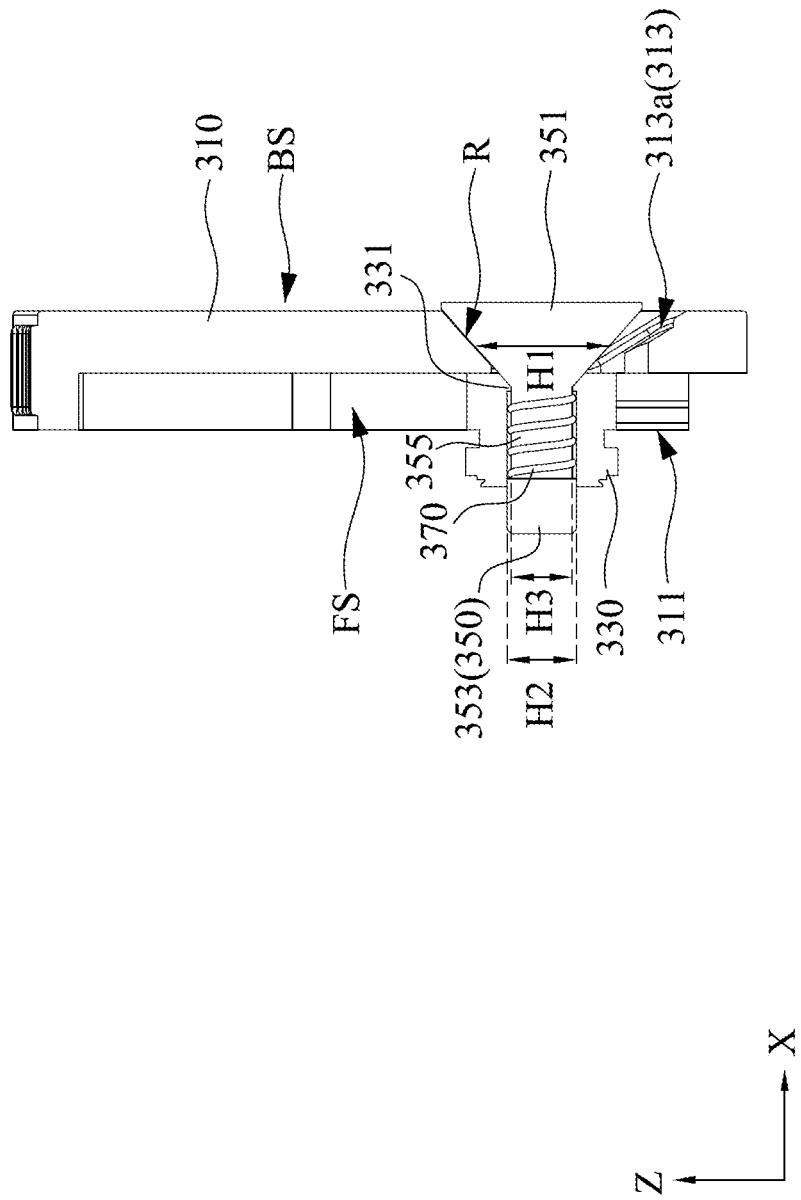
FIG. 9 illustrates a cross section view taken from the cross section line A1 in FIG. 7.
Figure 11:
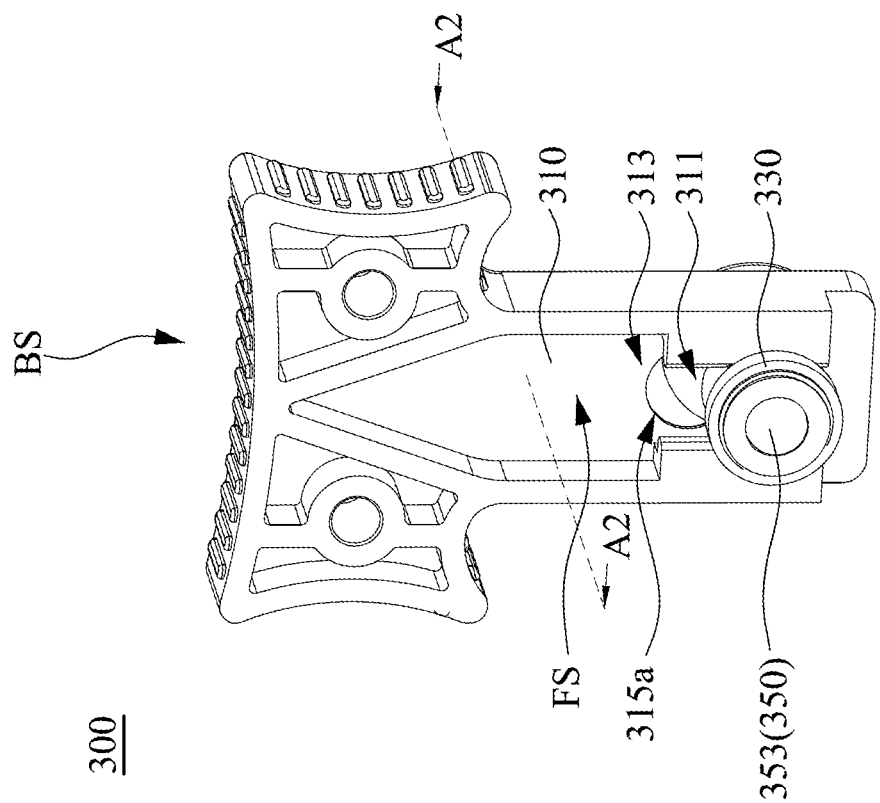
FIG. 11 illustrates a front view of the fixing device in accordance with some embodiments of the present invention.
Figure 12:
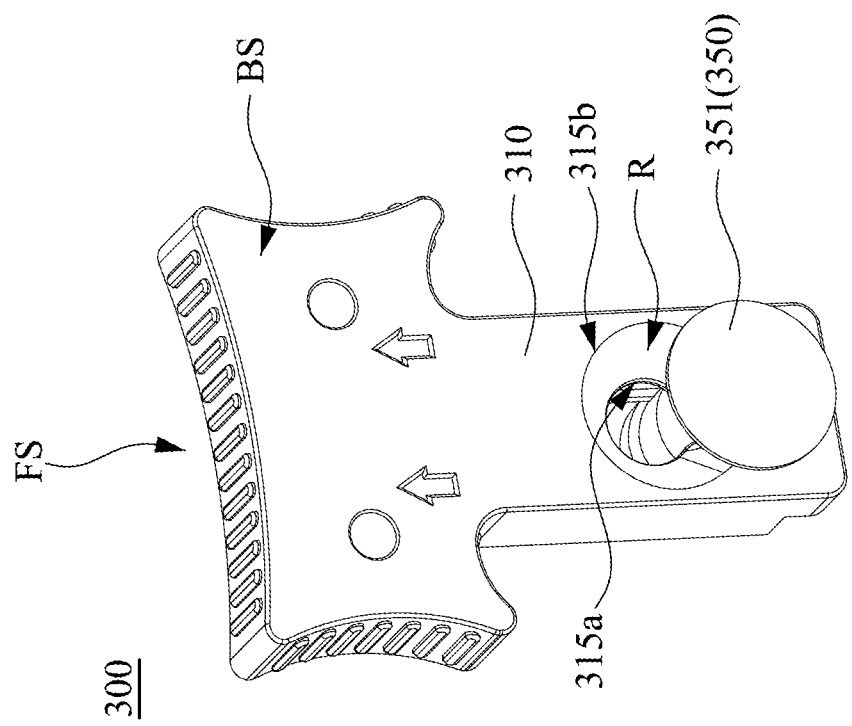
FIG. 12 illustrates a back view of the fixing device in accordance with some embodiments of the present invention.
Figure 13:
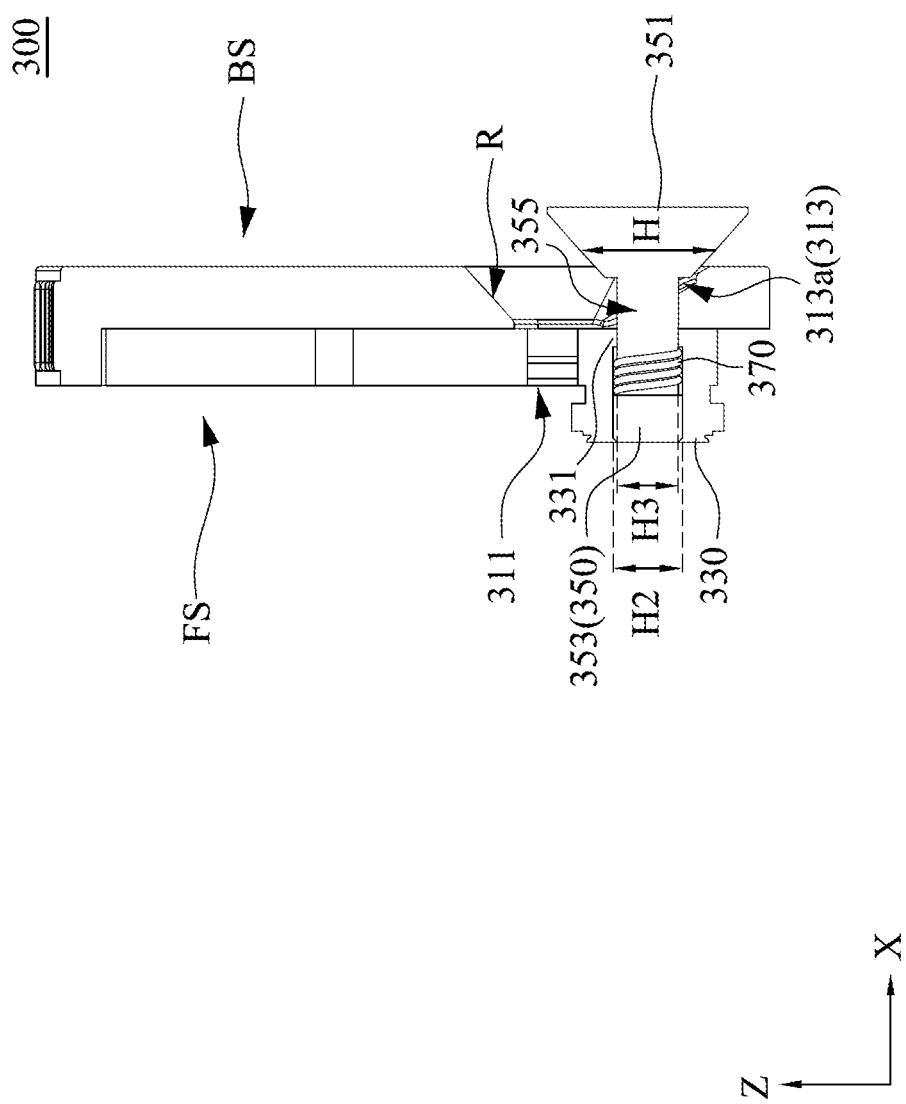
FIG. 13 illustrates a cross section view taken from the cross section line A2 in FIG. 11.

Please refer to FIGS. 6-13. FIGS. 7 and 8 respectively illustrate a front view and a back view of the fixing device 300 in FIG. 6. FIG. 9 illustrates a cross section view taken from cross section line A1 in FIG. 7. FIGS. 11 and 12 respectively illustrate a front view and a back view of the fixing device 300. FIG. 13 illustrates a cross section view taken from a cross section line A2 in FIG. 11. In some embodiments of the present invention, two fixing devices 300 extend through two upper holes 210 of the electronic assembly 200, and the two upper holes 210 are disposed at two opposite sides of the electronic assembly 200. The present invention is not limited in this respect. In other embodiments of the present invention, the electronic assembly 200 of the accommodation device 10 has only one single upper hole 210 and one single fixing device 300 extending through the upper hole 210. In addition, the fixing device 300 includes a main body 310, a sliding block 330, and a fixing rod 350. Specifically, the main body 310 has a front side FS and a back side BS corresponding to the front side FS in a horizontal axis X, and the main body 310 is substantially T-shaped such that the users can pull the main body 310 upward by their fingers. Moreover, the main body 310 includes a sliding rail 311 and a guiding hole 313, and the sliding rail 311 is disposed at the front side FS of the main body 310 and extends along a vertical axis Z. The guiding hole 313 adjoins the sliding rail 311 and extends through the main body 310 along the horizontal axis X, so the guiding hole 313 extends from the back side BS of the main body 310 to the front side FS and communicates with the sliding rail 311. In other words, the sliding rail 311 is in front of the guiding hole 313. The sliding block 330 is slidably connected to the sliding rail 311, and the sliding rail 311 is sunken into the front side FS of the main body 310, the sliding block 330 is substantially in a circular-pillar shape and has a side recess which joins the sliding rail 311. The fixing rod 350 is configured to fix the electronic assembly 200 to the main body 310, and the fixing rod 350 is movably connected to the sliding block 330 and against the guiding hole 313. The fixing rod 350 extends through the fixing hole 230 and the positioning hole 150, so as to fix the electronic assembly 200 to the accommodation structure 100. In addition, the main body 310 is configured to receive a force to move relative to the sliding block 330 along the vertical axis Z, and the guiding hole 313 drives the fixing rod 350 to move outside of the positioning hole 150 along the horizontal axis X. Therefore, when the electronic assembly 200 is in the fixing state, the electronic assembly 200 can be stably fixed in the accommodation structure 100 although liquid in the accommodation structure 100 would generate buoyancy to the electronic assembly 200. Moreover, the users can pull the main body 310 upward along the vertical axis Z for easily release the fixing state of the electronic assembly 200, so as to drive the electronic assembly 200 to move upward and move outside of the accommodation structure 100 in a vertical direction. Therefore, the unlocking operation direction to release the fixing state of the electronic assembly 200 is the same as the detaching direction about moving the electronic assembly 200 out of the accommodation structure 100, and thus applying a force in a single direction can unlock the electronic assembly 200 and move the electronic assembly 200 out of the accommodation structure 100, so as to improve the efficiency to detach the electronic assembly 200 from the accommodation structure 100. Furthermore, when the main body 310 is a T-shaped structure which vertically extends and has two wings above liquid, the user can pull the two wings of the T-shaped main body 310 without touching the liquid, so as to release the fixing state of the electronic assembly 200.

Please refer to FIGS. 7-9 and 11-13. In some embodiments of the present invention, the fixing rod 350 further includes a cone portion 351 in contact with an inner surface of the guiding hole 313, and the cone portion 351 has a vertical length H1 which increases toward the back side BS of the main body 310. In other words, the cone portion 351 has a cross section feature in trapezoid, and the cone portion 351 has the vertical length H1 decreasing toward the front side FS of the main body 310. Therefore, the guiding hole 313 can guide the fixing rod 350 to move relative to the main body 310 along the horizontal axis X. In addition, the guiding hole 313 extends through the main body 310 along the horizontal axis X, and the guiding hole 313 has an internal diameter R increasing toward the back side BS of the main body 310. In other words, the guiding hole 313 has the internal diameter R decreasing toward the front side FS of the main body 310. Specifically, the guiding hole 313 has a sloped bottom surface 313a which is higher at the front side FS and lower at the back side BS. Therefore, when the main body 310 move upward relative to the sliding block 330 and move upward relative to the fixing rod 350, the guiding hole 313 can guide the fixing rod 350 to move outside of the fixing hole 230 along the horizontal axis X (referring to FIGS. 6 and 10).

Please refer to FIGS. 7-9 and FIGS. 11-13. In some embodiments of the present invention, the fixing rod 350 horizontally extends through the sliding block 330, and the sliding block 330 limits the fixing rod 350 in the vertical axis Z such that the fixing rod 350 is configured to move relative to the sliding block 330 along the horizontal axis X. Therefore, when the sliding block 330 vertically moves along the sliding rail 311, the sliding block 330 can simultaneously drive the fixing rod 350 to vertically move such that the guiding hole 313 guides the fixing rod 350 to move outside of the fixing hole 230 along the horizontal axis X.

Figure 14:
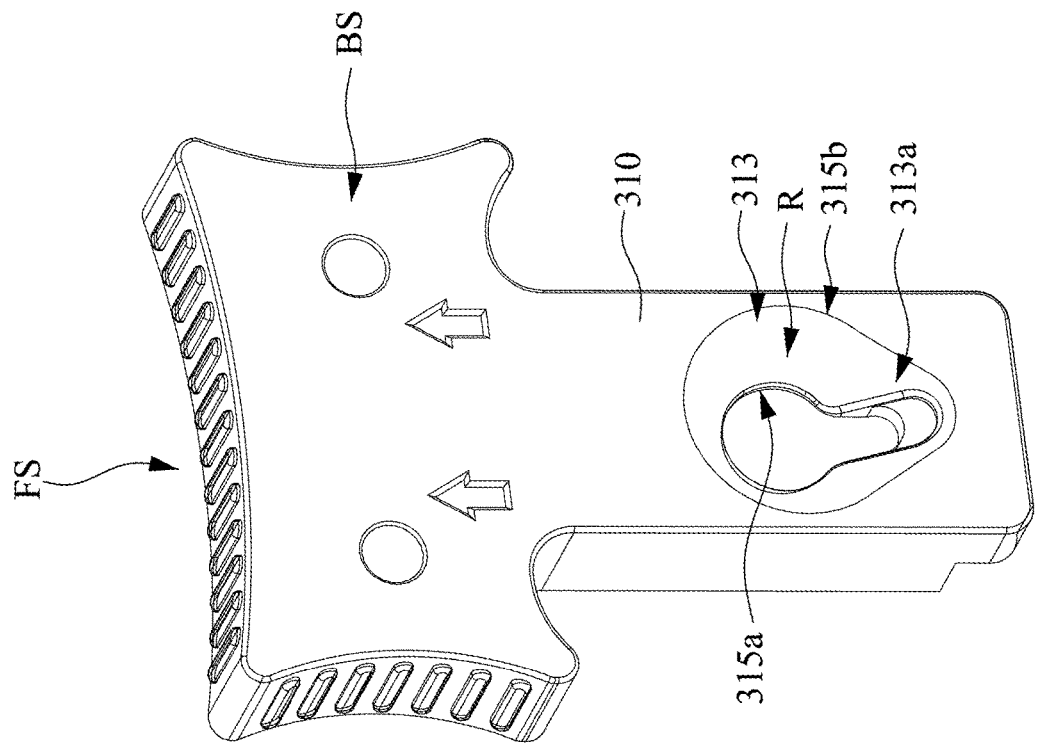
FIG. 14 illustrates a back view of the fixing device in accordance with some embodiments of the present invention.

Please refer to FIGS. 6-13. In some embodiments of the present invention, the fixing device 300 includes an elastic component 370 such as spring, and the fixing rod 350 includes a head portion 353 and a neck portion 355. The cone portion 351, the head portion 353, and the neck portion 355 are arranged along the horizontal axis X, and the neck portion 355 is disposed between the head portion 353 and the cone portion 351. In addition, the head portion 353 has a vertical length H2 greater than a vertical length H3 of the neck portion 355, and the cone portion 351 has the vertical length H1 equal to or greater than the vertical length H3 of the neck portion 355. The sliding block 330 includes a blocking portion 331, and the elastic component 370 is disposed between the head portion 353 and the blocking portion 331. Referring to FIGS. 11 and 14, when the fixing device 300 receives a force to move upward relative to the sliding block 330 along the vertical axis Z and guides the fixing rod 350 to move outside of the positioning hole 150 (referring to FIG. 3) along the horizontal axis X, the elastic component 370 is pressured by the blocking portion 331 and the head portion 353 to elastically deform. Referring to FIGS. 5 and 9, when the fixing device 300 is moving downward along the vertical axis Z to drives the fixing rod 350 to align with the positioning hole 150 (referring to FIG. 3) and the fixing hole 230, the elastic component 370 elastically recover for pushing the fixing rod 350 such that the fixing rod 350 protrudes from the sliding block 330. The fixing rod 350 extends through the positioning hole 150 and the fixing hole 230, and the fixing rod 350 fixes the electronic assembly 200 to the main body 310. Therefore, a locking operation direction to switch the electronic assembly 200 to the fixing state is the same as the insertion direction to move the electronic assembly 200 into the accommodation structure 100. In addition, a force applied to one single direction can simultaneously insert the electronic assembly 200 into the accommodation structure 100 and lock the electronic assembly 200 to the accommodation structure 100, so as to improve the efficiency about assembling the electronic assembly 200 to the accommodation structure 100.

Please refer to FIG. 14. FIG. 14 illustrates a back view of the fixing device 300 in accordance with some embodiments of the present invention, and the sliding block 330 and the fixing rod 350 are neglected. In some embodiments of the present invention, the guiding hole 313 has a first water drop outline 315a which has a wide top and a narrow bottom at the front side FS of the main body 310, and the guiding hole 313 has a second water drop outline 315b which has a wide top and a narrow bottom at the back side BS of the main body 310. The first water drop outline 315a has a diameter smaller than a diameter of the second water drop outline 315b, so as to guide the fixing rod 350 to move outside of the fixing hole 230 along the horizontal axis X and move toward the back side BS of the main body 310.

Please refer to FIGS. 2 and 4 simultaneously. In some embodiments of the present invention, two top portions 131 of the two walls 130 extend upward and gradually extend away from each other, so a horizontal distance D between the top portions 131 of the two walls 130 gradually increase upward along the vertical axis Z. As such, when the electronic assembly 200 is put in the path M of the accommodation structure 100 from the top opening 110, the two top portions 131 of the two walls 130 are able to guide the electronic assembly 200 to align between the two walls 130, so as to prevent the electronic assembly 200 from hitting due to dislocation as being located between the two walls 130. In some embodiments of the present invention, the electronic assembly 200 includes a curved protrusion 250 which is disposed at a bottom of the electronic assembly 200, and the curved protrusion 250 is against the two top portions 131 of the two walls 130 to be guided by the two top portions 131 for aligning with the path M when the electronic assembly 200 is about to move to between the two walls 130.

In addition, the accommodation structure 100 further includes a guiding structure 170 which is located between the two walls 130 and is above the positioning hole 150, and the guiding structure 170 can be a curved board or a flat board. Moreover, the guiding structure 170 extends from the interior surface 140, and the guiding structure 170 extends upward and gradually extend away from the path M and the corresponding interior surface 140. Therefore, the guiding structure 170 is sloped with the interior surface 140 and extends outward relative to the path M and the interior surface 140. When the electronic assembly 200 is about to move between the two walls 130, the guiding structure 170 guides the electronic assembly 200 to the path M along the horizontal axis X.

Figure 15:
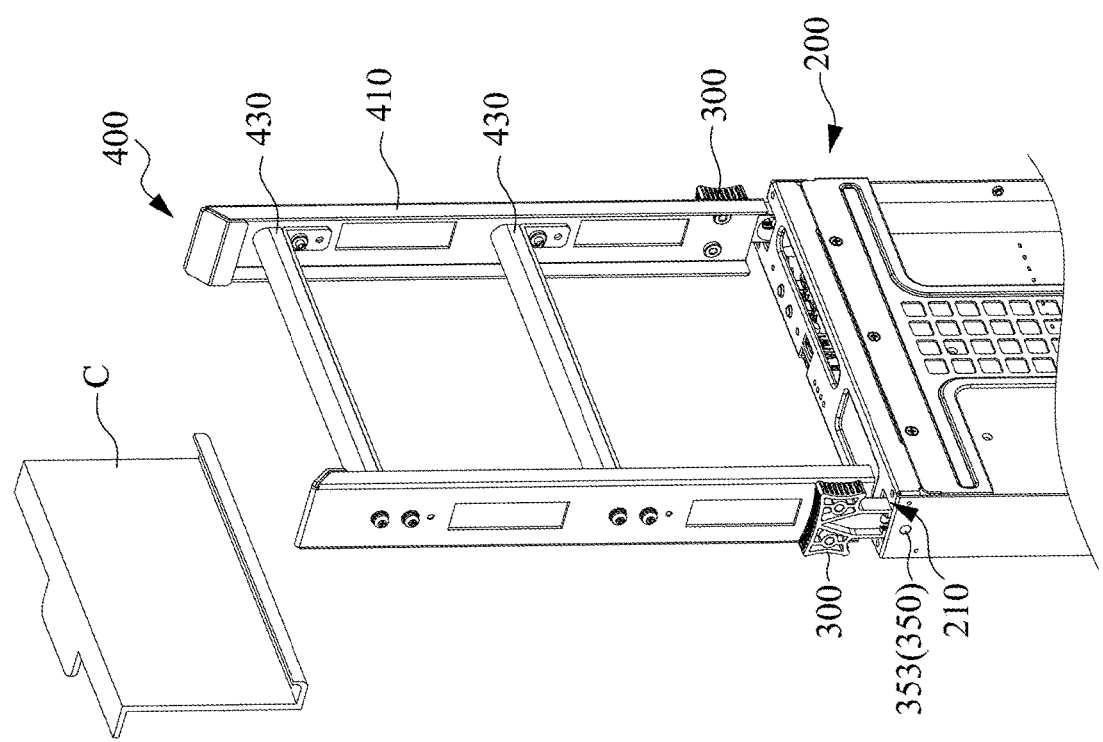

Please refer to FIGS. 15 and 16. In some embodiments of the present invention, the accommodation device 10 includes a hanging bracket 400 which includes two lateral arms 410 and a supporting rod 430, and the supporting rod 430 is connected between the two lateral arms 410. The two lateral arms 410 respectively join the two fixing devices 300, and a hook C is configured to fix the supporting rod 430. The user can pull the hook C by their body members or an automatic arm to drive the fixing rods 350 of the two fixing devices 300 to move outside of the positioning hole 150 (referring to FIG. 3) such that the electronic assembly 200 can further move outside of the accommodation structure 100. Specifically, the hook C drives the fixing device 300 to move in the unlocking operation direction along the vertical axis Z such that the electronic assembly 200 is detachable from the accommodation structure 100. Therefore, the electronic assembly 200 is moved out of the accommodation structure 100 in the vertical axis Z along the detaching direction which is the same as the unlocking operation direction.

In embodiments of the present invention, an insertion direction of the electronic assembly to an accommodation structure is the same as a locking operation direction thereof, and a detaching direction of the electronic assembly from the accommodation is the same as an unlocking operation direction thereof. As such, a user or an automatic arm can efficiently and easily apply a force in one single direction for inserting and locking the electronic assembly to the accommodation structure. The user or the automatic arm can also apply a force in one single direction to detaching and unlocking the electronic assembly from the accommodation structure. Therefore, the present invention can not only improve the traditional manufacturing process but also make the efficiency about automatic production and the efficiency to assemble electrical components better. In addition, the fixing device can stably fix a server to the accommodation structure in a locking state, so as to prevent the buoyancy generated by the liquid in the accommodation structure from affecting the server. The user can easily pull the fixing device to release the server from the locking state, and the user can move the server out of the accommodation structure without touching the liquid.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An accommodation device, comprising:
   an accommodation cabinet having a top opening, two walls, and a positioning hole, wherein the two walls are parallel and disposed at an interior surface of the accommodation cabinet, a path is defined between the two walls, and the positioning hole is disposed at the interior surface and between the two walls;
   a shell having an upper hole and at least one fixing hole, wherein the shell is configured to move between the two walls along a vertical axis;
   two fixing devices extending through the upper hole, wherein each fixing device includes:
   a main body having a concave sliding rail and a guiding hole, wherein the sliding rail is disposed at and vertically extends along a front side of the main body, and the guiding hole is continuous with a concave space of the sliding rail and horizontally extends through the main body, wherein the guiding hole has a water-drop-shaped outline which has a relatively wide top and a relatively narrow bottom;
   a sliding block slidably connected to the sliding rail; and
   a fixing rod configured to fix the shell to the main body, wherein the fixing rod is movably connected to the sliding block and in contact with the main body, the fixing rod extends through the fixing hole and the positioning hole, wherein the main body is configured to receive a force to vertically move relative to the sliding block such that the guiding hole guides the fixing rod to move into the positioning hole or move outside of the positioning hole in a horizontal axis;
   a hanging bracket comprises two parallel lateral arms and two parallel supporting rods which are perpendicularly connected to and between the two parallel lateral arms, and wherein the two parallel lateral arms join the two fixing devices respectively; and
   a hook configured to fix to one of the two parallel supporting rods.

2. The accommodation device of claim 1, further comprising an elastic component, wherein the fixing rod comprises a head portion and a neck portion, the sliding block includes a blocking portion, and the elastic component is disposed at the neck portion and between the head portion and the blocking portion.

3. The accommodation device of claim 1, wherein the fixing rod comprises a cone portion which is in contact with an inner surface of the guiding hole, the cone portion has a vertical length gradually increasing toward a back side of the main body.

4. The accommodation device of claim 1, wherein the guiding hole has an interior diameter increasing toward a back side of the main body.

5. The accommodation device of claim 1, wherein the fixing rod horizontally extends through the sliding block such that the sliding block limits the fixing rod in a vertical axis, and the fixing rod is configured to move relative to the sliding block in a horizontal axis.

6. The accommodation device of claim 1, wherein a distance between two top portions of the two walls gradually increases upward along vertical axis.

7. The accommodation device of claim 1, wherein the accommodation cabinet includes a guiding structure which is disposed between the two walls and is above the positioning hole, wherein the guiding structure extends upward and gradually extends away from the path.

8. An accommodation device, comprising:
   an accommodation cabinet having a top opening, two walls, and a positioning hole, wherein the two walls are parallel and disposed at an interior surface of the accommodation cabinet, a path is defined between the two walls, and the positioning hole is disposed at the interior surface and between the two walls;
   a shell having an upper hole and at least one fixing hole, wherein the shell is configured to move between the two walls along a vertical axis;
   two fixing devices extending through the upper hole, wherein each fixing device includes:
   a main body having a concave sliding rail and a guiding hole, wherein the sliding rail is disposed at and vertically extends along a front side of the main body, and the guiding hole is continuous with a concave space of the sliding rail and horizontally extends through the main body, wherein the guiding hole has a water-drop-shaped outline which has a relatively wide top and a relatively narrow bottom;
   a sliding block slidably connected to the sliding rail; and
   a fixing rod configured to fix the shell to the main body, wherein the fixing rod is movably connected to the sliding block and in contact with the main body, the fixing rod extends through the fixing hole and the positioning hole, wherein the main body is configured to move downward relative to the sliding block such that the guiding hole guides the fixing rod to move into the positioning hole, the main body is also configured to move upward relative to the sliding block such that the guiding hole guides the fixing rod to move outside of the positioning hole;
   a hanging bracket comprises two parallel lateral arms and two parallel supporting rods which are perpendicularly connected to and between the two parallel lateral arms, and wherein the two parallel lateral arms join the two fixing devices respectively; and
   a hook configured to fix to one of the two parallel supporting rods.

9. The accommodation device of claim 8, further comprising an elastic component, wherein the fixing rod comprises a head portion and a neck portion, the sliding block includes a blocking portion, and the elastic component is disposed at the neck portion and between the head portion and the blocking portion.

10. The accommodation device of claim 8, wherein the fixing rod comprises a cone portion which is in contact with an inner surface of the guiding hole, the cone portion has a vertical length gradually increasing toward a back side of the main body.

11. The accommodation device of claim 8, wherein the guiding hole has an interior diameter increasing toward a back side of the main body.

12. The accommodation device of claim 8, wherein the fixing rod horizontally extends through the sliding block such that the sliding block limits the fixing rod in a vertical axis, and the fixing rod is configured to move relative to the sliding block in a horizontal axis.

* * * * *